(12) United States Patent
Naito et al.

(10) Patent No.: US 10,358,263 B2
(45) Date of Patent: Jul. 23, 2019

(54) ULTRA-HIGH PURITY STORAGE AND DISPENSING OF LIQUID REAGENTS

(71) Applicant: ADVANCED TECHNOLOGY MATERIALS, INC., Danbury, CT (US)

(72) Inventors: Donn K. Naito, Marble Falls, TX (US); Andy Krell, Spicewood, TX (US); Mitchell W. McFeron, Austin, TX (US); Steven Jackson, Burnet, TX (US); Joel Robison, Bertram, TX (US)

(73) Assignee: Entegris, Inc., Billerica, MA (US)

( * ) Notice: Subject to any disclaimer, the term of this patent is extended or adjusted under 35 U.S.C. 154(b) by 236 days.

(21) Appl. No.: 14/419,458

(22) PCT Filed: Aug. 7, 2013

(86) PCT No.: PCT/US2013/054025
§ 371 (c)(1),
(2) Date: Feb. 3, 2015

(87) PCT Pub. No.: WO2014/025937
PCT Pub. Date: Feb. 13, 2014

(65) Prior Publication Data
US 2015/0210430 A1    Jul. 30, 2015

Related U.S. Application Data

(60) Provisional application No. 61/681,510, filed on Aug. 9, 2012.

(51) Int. Cl.
| | | |
|---|---|---|
| *B65B 31/00* | (2006.01) | |
| *B65D 25/14* | (2006.01) | |
| *B01J 19/02* | (2006.01) | |
| *B01J 4/00* | (2006.01) | |

(Continued)

(52) U.S. Cl.
CPC ............... *B65D 25/14* (2013.01); *B01J 4/00* (2013.01); *B01J 19/02* (2013.01); *B65D 25/38* (2013.01);
(Continued)

(58) Field of Classification Search
CPC ............. B65D 90/04; F17C 2203/0604; Y10T 428/3154
(Continued)

(56) References Cited

U.S. PATENT DOCUMENTS

| | | |
|---|---|---|
| 5,046,638 A | 9/1991 | Wolf |
| 5,603,999 A | 2/1997 | Namura et al. |

(Continued)

FOREIGN PATENT DOCUMENTS

| | | |
|---|---|---|
| CN | 101839394 A | 9/2010 |
| JP | H04-101838 A | 4/1992 |

(Continued)

OTHER PUBLICATIONS

Sharpsville Container Corporation, "Sharpsville Container Corporation Brochure", 2009, pp. 1-15, Published in: Sharpsville, PA.

(Continued)

*Primary Examiner* — Ellen S Wood
(74) *Attorney, Agent, or Firm* — Entegris, Inc.

(57) ABSTRACT

A supply vessel for dispensing of ultra-high purity chemical reagents, comprising a metal container defining an enclosable interior volume including interior surface structure, wherein the interior surface structure is coated with an ultra-high purity effective polyperfluoroalkoxyethylene coating. Such supply vessel may for example be utilized for storage and dispensing of ultra-high purity chemical reagent to a semiconductor manufacturing tool, or a tool for manufacturing of flat-panel displays, or solar panels.

9 Claims, 2 Drawing Sheets

(51) Int. Cl.
    *B65D 25/38*     (2006.01)
    *B65D 43/02*     (2006.01)
    *B65D 85/00*     (2006.01)
    *H01L 21/67*     (2006.01)

(52) U.S. Cl.
    CPC ............ *B65D 43/02* (2013.01); *B65D 85/70* (2013.01); *H01L 21/67023* (2013.01); *B01J 2219/0245* (2013.01)

(58) Field of Classification Search
    USPC .............. 428/35.8; 206/524.3, 524.5, 6
    See application file for complete search history.

(56) References Cited

U.S. PATENT DOCUMENTS

| | | |
|---|---|---|
| 5,928,743 A | 7/1999 | Bealky et al. |
| 6,581,649 B2 | 6/2003 | Jursich |
| 2010/0043918 A1 | 2/2010 | Birtcher et al. |
| 2010/0237085 A1 | 9/2010 | Birtcher et al. |

FOREIGN PATENT DOCUMENTS

| | | |
|---|---|---|
| JP | 6-89878 B2 | 11/1994 |
| JP | H09-318497 A | 12/1997 |
| JP | H10-119973 A | 5/1998 |
| JP | 2005-236050 A | 9/2005 |
| TW | 200804143 A | 1/2008 |
| WO | 8606705 A1 | 11/1986 |
| WO | 2014/025937 A1 | 2/2014 |

OTHER PUBLICATIONS

Note: For the non-patent literature citations that no month of publication is indicated, the year of publication is more than 1 year prior to the effective filing date of the present application.

ULTRA-HIGH PURITY STORAGE AND DISPENSING OF LIQUID REAGENTS

CROSS-REFERENCE TO RELATED APPLICATIONS

This application is a U.S. national phase under the provisions of 35 U.S.C. § 371of International Patent Application No. PCT/US13/54025 filed Aug. 7, 2013, which in turn claims the benefit under 35 U.S.C. § 119 of U.S. Provisional Patent Application No. 61/681,510 filed Aug. 9, 2012 in the names of Donn K. Naito, et al. for "ULTRA-HIGH PURITY STORAGE AND DISPENSING OF LIQUID REAGENTS". The disclosures of International Patent Application No. PCT/US13/54025 and U.S. Provisional Patent Application No. 61/681,510 are hereby incorporated herein by reference, in their respective entireties, for all purposes.

FIELD

The present disclosure relates to supply vessels for storage and dispensing of ultra-high purity reagents, e.g., for use in the manufacture of semiconductor products.

DESCRIPTION OF THE RELATED ART

In the supply of ultra-high purity reagents used in the manufacture of semiconductor products, a wide variety of source vessels has been developed. As features and dimensions of microelectronic devices have been progressively reduced to the nanoscale regime, reagents that are used in the fabrication of such devices, .e.g., in doping, vapor deposition, masking, etching, cleaning, and other operations, have correspondingly been required to be of increasingly high purity.

This change of chemical reagent purity requirements, from part-per-million concentrations of contaminants, to parts-per-billion concentrations, to parts-per-trillion concentrations, has correspondingly required source vessels that can be filled with such chemical reagents without diminution of ultra-high purity thereof.

SUMMARY

The present disclosure relates to supply vessels for storage and dispensing ultra-high purity reagents.

In one aspect, the disclosure relates to a supply vessel for dispensing of ultra-high purity chemical reagents, comprising: a metal container defining an enclosable interior volume including interior surface structure, wherein the interior surface structure is coated with an ultra-high purity effective polyperfluoroalkoxyethylene coating.

Other aspects, features and embodiments of the invention will be more fully apparent from the ensuing disclosure and appended claims.

DETAILED DESCRIPTION

The present invention relates to supply vessels for storage and dispensing of ultra-high purity chemical reagents, e.g., for applications such as semiconductor processing, fabrication of solar cells, manufacture of flat-panel displays, synthesis of nano materials, etc.

As used herein, the term "ultra-high purity effective polyperfluoroalkoxyethylene coating" refers to a coating that when present on interior metal surface structure of an ampoule, is effective to maintain deionized water filling the ampoule and initially containing less than 50 ppt of metals, at a metals concentration of less than 50 ppt after storage in the ampoule at 30° C. for a period of 40 hours.

Figure 1:
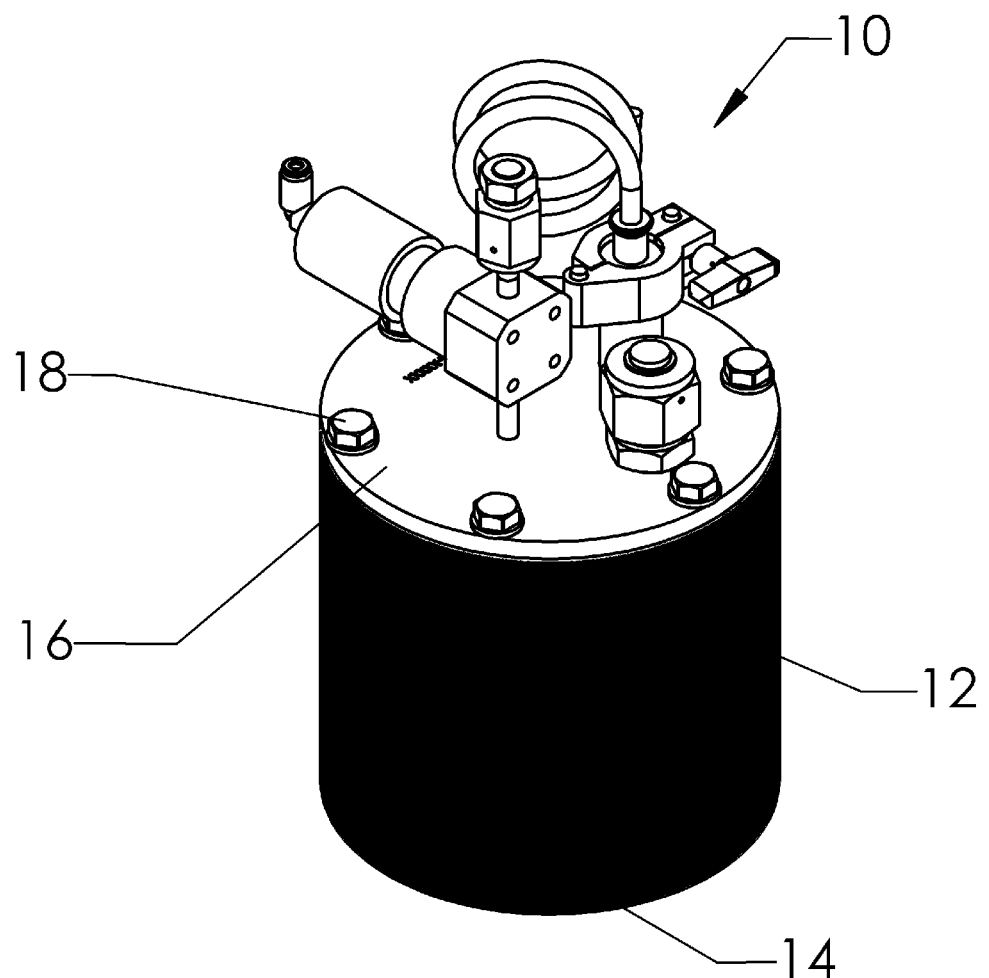
FIG. 1 is a perspective view of a supply vessel, according to one embodiment of the present disclosure.

FIG. 1 is a perspective view of a supply vessel 10, according to one embodiment of the present disclosure. As illustrated, the supply vessel 10 for dispensing of ultra-high purity chemical reagents comprises a metal container 12 defining an enclosable interior volume. The container includes a flanged base member 14 defining a floor of the container. A cover 16 is secured to the container by mechanical fasteners 18, such as bolt and nut assemblies. The cover includes spaced-apart inlet and outlet ports with which is associated flow circuitry for introduction of ultra-high purity chemical reagent to the vessel, and dispensing of ultra-high purity chemical reagent from the vessel. The inlet port and associated flow circuitry may also be used for pressure-mediated dispensing of the ultra-high purity chemical reagent fluid in the container, e.g., by introduction of an inert gas to exert pressure on the fluid in the vessel, to effect the dispensing operation for the ultra-high purity chemical reagent.

Figure 2:
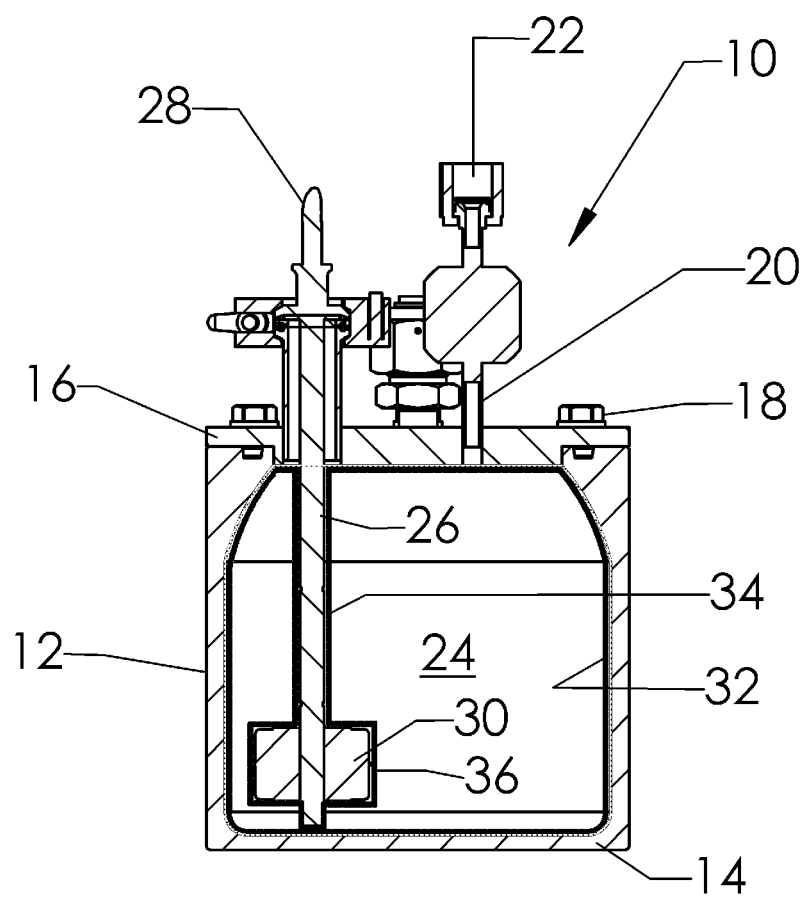
FIG. 2 is a cross-sectional view in elevation of the supply vessel of FIG. 1, showing the details of the structure thereof.

FIG. 2 is a cross-sectional view in elevation of the supply vessel of FIG. 1, showing the details of the structure thereof. Reference numerals for corresponding structural elements of FIG. 1 are correspondingly shown in FIG. 2 as identified by the same reference numerals.

As shown in the cross-sectional elevation view of FIG. 2, the supply vessel 10 includes the metal container 12 having the flanged base member 14 defining the floor thereof, to constitute an enclosable interior volume that is closed by the cover 16 secured to the container 12 by mechanical fasteners 18. The cover of the supply vessel includes an inlet structure including inlet conduit 20 in fluid flow communication with inlet port 22, for introduction of ultra-high purity chemical reagent to the container interior volume 24, and subsequently, and optionally, introduction of pressurizing gas for mediating pressure dispensing of the fluid contained in the interior volume.

The cover of the supply vessel further includes a discharge conduit 26, open at its lower end to permit egress of fluid from the vessel through such conduit. The discharge conduit extends upwardly through a discharge port in cover 16, and is coupled to discharge flow circuitry 28 coupled to the discharge conduit by an appropriate fitting. The discharge conduit 26 at its lower portion may have associated therewith a liquid level sensor 30 that may be arranged for generating a signal when the fluid charge in the interior volume 24 has declined to a predetermined lower limit indicating the onset of an empty condition in the container. The disclosure contemplates open-top containers, as well as vessels equipped with covers, lids, closures or the like.

In accordance with the present disclosure, the internal surface structure in the enclosable interior volume of the supply vessel is coated with an ultra-high purity effective polyperfluoroalkoxyethylene (PFA) coating. The PFA coating comprises a PFA coating layer 32 on the side wall, floor, and cover surfaces bounding the interior volume 24 of the vessel as well as a PFA coating layer 36 on the outside surface of the discharge conduit 26 and liquid level sensor 30. In such manner, the interior surface structure of the supply vessel is coated with the PFA coating.

The thickness of the PFA coating on the interior surface structure of the supply vessel can be any suitable thickness that is effective to provide and preserve the ultra-high purity character of chemical reagents that are stored in and dispensed from the vessel. In some embodiments, the PFA coating on interior surface structure of the vessel can have a thickness that is in a range of from 2.5 to 12 mils (63.5 μm to 304.8 μm). In other embodiments, thicker PFA coatings, e.g., in a range of from 15 to 50 mils (381 μm to 1270 μm), may be employed.

The PFA coating may be applied to the end interior surface structure of the supply vessel, e.g., on the underside of the cover, on the sidewalls and floor of the container, and on the exterior surface of the discharge conduit, float sensor, and other interior surface structure elements, in any suitable manner. In one embodiment, the PFA coating is applied by powder coating of such surface structure. Other application methods for the coating may be employed, provided that the PFA coating applied to the vessel interior surfaces is an "ultra-high purity effective polyperfluoroalkoxyethylene coating" within the meaning of such term as set out hereinabove.

Although PFA resin has previously been proposed for use in forming extruded containers and tubing for water and chemical confinement, it has been found necessary to blend polytetrafluoroethylene (PTFE) with the PFA, as a blended copolymer composition, in order to overcome deficiencies of the PFA when used alone for such applications. By contrast, no such blending of the PFA with PTFE or other copolymer materials is necessary in the fabrication and use of the supply vessel of the present disclosure, and PFA coating films of the present disclosure have been found highly effective in providing and maintaining ultra-high purity of chemical reagents introduced to and dispensed from the supply vessel of the present disclosure.

The powder coating or other application method for forming the PFA coating on the interior surface structure of the supply vessel is advantageously carried out after suitable cleaning of the container so that the interior surface structure of the vessel is suitably contaminant-free in character. For example, a cleaning solution may be applied to the vessel surfaces to be coated, followed by rinsing, and repeated applications of the cleaning solution, until the interior surfaces to be coated are sufficiently clean in character. The coating of the interior surfaces of the vessel may be carried out under vacuum and at elevated temperature, to ensure that the coating is applied in a smooth and uniform manner to the vessel interior surfaces.

A significant contaminant of ultra-high purity chemical reagents in supply vessels including metal containers is metal species deriving from the metal container of the vessel, e.g., contaminant species such as lithium, beryllium, sodium, magnesium, aluminum, potassium, calcium, titanium, vanadium, chromium, manganese, iron, nickel, cobalt, copper, zinc, gallium, germanium, arsenic, strontium, silver, cadmium, indium, tin, antimony, barium, tungsten, gold, mercury, gallium, led, bismuth, thorium, uranium, zirconium, molybdenum, niobium, and tantalum. The supply vessel of the present disclosure by its PFA coating enables contaminant concentrations in the parts per trillion (ppt) regime to be maintained for substantial periods of time after initial charging with the high-purity chemical reagent.

The ultra-high purity chemical reagent stored in and dispensed from the supply vessel can be of any suitable type, and may include solvents, chemical precursors, photoresists, cleaning agents, dopant materials, organometallic reagents, or other chemicals requiring use at ultra-high purity. In one embodiment the chemical reagent comprises ultra-high purity deionized water. In another embodiment, the chemical reagent comprises tetraethylorthosilicate (TEOS). Although the ultra-high purity chemical reagent may be of a liquid character, the disclosure contemplates materials of any suitable type and phase as being stored in and dispensed from the supply vessel. Thus, the material placed in the vessel for subsequent dispensing can be a liquid, gas, or solid, or present in the form of solutions, suspensions, slurries, multiphase compositions, liquid mixtures, solid mixtures, or gas mixtures. The vessel may for example be heated in use, to cause volatilization of a solid or liquid material for vapor or gas dispensing.

The metal container in the supply vessel of the present disclosure can be of any suitable metal construction. For example, the vessel may include container and cover components formed of steel, titanium, aluminum, or other metal compositions, including pure metals, metal alloys, metal blends, metal composite materials, etc. In one embodiment, the container and cover are formed of stainless steel.

In a specific example, a supply vessel of the type shown schematically in FIGS. 1 and 2 is fabricated of 316 stainless steel, and is coated on its interior surface structure with a PFA coating layer having a thickness in a range of from 4 to 12 mils (0.1 millimeter to 0.3 millimeter). The ampoule has a height of 5.375 inches (13.7 cm) and a diameter of 4.94 inches (12.5 cm). Such vessel is effective to maintain parts per trillion purity deionized water at such purity level for at least two weeks after charging of the vessel.

The supply vessel of the present disclosure may be provided as a component of a wide variety of ultra-high purity chemical reagent-utilizing systems. For example, the supply vessel of the present disclosure may be comprised in an ultra-high purity deionized water dispensing apparatus, in various embodiments. In other embodiments, the supply vessel of the present disclosure may be comprised in a semiconductor manufacturing tool, or a tool for manufacturing flat-panel displays, or solar panels. The foregoing system utilizations of the supply vessel are merely illustrative, and it will be appreciated that numerous alternative usages are contemplated, in which the ultra-high purity chemical reagent supply vessel of the present disclosure provides a source of ultra-high purity chemical reagent to any of a wide variety of processes and end-use applications.

While the disclosure has been set out herein in reference to specific aspects, features and illustrative embodiments, it will be appreciated that the utility of the disclosure is not thus limited, but rather extends to and encompasses numerous other variations, modifications and alternative embodiments, as will suggest themselves to those of ordinary skill in the field of the present disclosure, based on the description herein. Correspondingly, the invention as hereinafter claimed is intended to be broadly construed and interpreted, as including all such variations, modifications and alternative embodiments, within its spirit and scope.

What is claimed is:

1. A supply vessel for dispensing of ultra-high purity chemical reagents, comprising: a metal container comprising a removable cover defining an enclosable interior volume including interior surface structure coated with an ultra-high purity effective polyperfluoroalkoxyethylene coating, wherein the ultra-high purity effective polyperfluoroalkoxyethylene coating has a thickness in a range of from 2.5 to 12 mils and is not blended with another copolymer, and wherein the interior surface structure includes a container side wall, floor, and cover surfaces bounding the interior volume and surfaces of a discharge conduit and a float sensor within the interior volume.

2. The supply vessel of claim 1, wherein the container is additionally coated with the ultra-high purity effective polyperfluoroalkoxyethylene coating on exterior surfaces thereof.

3. The supply vessel of claim 1, wherein the removable cover comprises spaced apart inlet and outlet passages therein.

4. The supply vessel of claim 3, wherein the outlet passage communicates with a discharge conduit joined to the cover and extending into a lower portion of the interior volume of the supply vessel.

5. The supply vessel of claim 1, wherein the metal container is fabricated of a metal selected from the group consisting of steel, titanium, and aluminum.

6. The supply vessel of claim 1, wherein the metal container is fabricated of stainless steel.

7. The supply vessel of claim 1, comprised in an ultra-high purity deionized water dispensing apparatus.

8. The supply vessel of claim 1, comprised in a semiconductor manufacturing tool.

9. The supply vessel of claim 1, wherein the ultra-high purity effective polyperfluoroalkoxyethylene coating is applied by powder coating.

\* \* \* \* \*